(12) United States Patent
Charneau et al.

(10) Patent No.: US 6,518,776 B2
(45) Date of Patent: Feb. 11, 2003

(54) INDUCTIVE OR CAPACITIVE DETECTOR

(75) Inventors: Christian Charneau, Champniers (FR); Christophe Guichard, Angouleme (FR)

(73) Assignee: Schneider Electric Industries SA, Rueil-Malmaison (FR)

(*) Notice: Subject to any disclaimer, the term of this patent is extended or adjusted under 35 U.S.C. 154(b) by 0 days.

(21) Appl. No.: 09/846,242

(22) Filed: May 2, 2001

(65) Prior Publication Data

US 2001/0038291 A1 Nov. 8, 2001

(30) Foreign Application Priority Data

May 2, 2000 (FR) .............................. 00 05675

(51) Int. Cl.[7] .............................................. G01R 27/26
(52) U.S. Cl. ...................... 324/662; 340/561; 340/686.6
(58) Field of Search ................................ 324/662, 661, 324/658; 331/66, 74, 117 R, 167

(56) References Cited

U.S. PATENT DOCUMENTS

| | | | | |
|---|---|---|---|---|
| 4,015,208 A | * | 3/1977 | Hammer et al. ............... 328/39 |
| 4,159,622 A | * | 7/1979 | Akahane ................... 58/23 AC |
| 4,297,657 A | * | 10/1981 | Frerking ..................... 331/176 |
| 4,305,041 A | * | 12/1981 | Frerking ..................... 328/155 |
| 4,325,036 A | * | 4/1982 | Kuwabara ................... 331/176 |
| 4,380,745 A | * | 4/1983 | Barlow et al. ............... 331/176 |
| 4,513,259 A | * | 4/1985 | Frerking ..................... 331/176 |
| 4,879,531 A | * | 11/1989 | Tigges et al. ................. 331/65 |
| 5,214,668 A | * | 5/1993 | Satou et al. ................. 374/117 |
| 5,719,782 A | * | 2/1998 | Mitsuoka ..................... 364/484 |

FOREIGN PATENT DOCUMENTS

| | | |
|---|---|---|
| EP | 203 923 | 12/1986 |
| EP | 478 856 | 4/1992 |
| EP | 996 228 | 4/2000 |
| GB | 1 510 034 | 5/1978 |
| WO | WO 85/03820 | 8/1985 |

OTHER PUBLICATIONS

Patent Abstracts of Japan, vol. 006, No. 077(E–106), May 14, 1982 and JP 57 014219, Jan. 25, 1982.

* cited by examiner

Primary Examiner—Christine Oda
Assistant Examiner—Etienne P LeRoux
(74) Attorney, Agent, or Firm—Oblon, Spivak, McClelland, Maier & Neustadt, P.C.

(57) ABSTRACT

A proximity detector including a reference oscillator and a measurement oscillator, the frequency of which depends on the proximity of an object, particularly a metal object. A detection counter value A, which is controlled by the frequency F of the measurement oscillator, is compared to a set point counter value B to create the output signal. The set point counter value $B_0$, which is determined during the calibration operation, is corrected by a quantity C that depends mainly on the difference of the measured temperature $\theta$ compared to the calibration temperature $\theta_0$. The proximity detector may find particular application to the detection of ferrous or nonferrous objects by universal or selective, inductive or capacitive detecting elements.

8 Claims, 2 Drawing Sheets

INDUCTIVE OR CAPACITIVE DETECTOR

BACKGROUND OF THE INVENTION

The present invention relates to an inductive or capacitive proximity detector that is particularly capable of detecting ferrous or non-ferrous metals, or a capacitive proximity detector comprising an oscillator capable of transmitting a measurement signal the frequency of which is a function of the proximity of an object to be detected, and a digital processing circuit that controls an output of the detector as a function of the frequency of the measurement oscillator.

This type of proximity detector is described in German patent DE 32 04 405. In this detector two oscillators are provided that oscillate at the same frequency, one of the oscillators being inducted and the other oscillator not being inducted by the object to be detected. The oscillator outputs are applied to respective counters such that the counting difference observed in the presence of a target is used by a logic circuit that commutes an output signal.

British patent GB 1 510 034 describes an inductive proximity detector comprising a variable frequency oscillator and a reference oscillator that operate with a detection counter and a reference counter, said reference counter defining a counting interval for the detection counter.

The known proximity detectors do not take into account variations or drifts affecting the components of the processing circuit, particularly depending on the temperature, which therefore results in insufficient measurement accuracy and reliability.

The aim of the invention is to detect objects, particularly ferrous or non-ferrous metal objects, using frequency processing that ensures excellent measurement accuracy.

According to the invention the set point counter value is stored in a memory associated with the digital processing circuit and it is correctable particularly according to the temperature, and a calibration counter value is introduced into the memory when the detector is calibrated in the presence of an object located at the nominal range, the set point counter value being obtained by correcting the calibration value according to the temperature.

Preferably, the set point counter value is corrected cyclically, for example at each measurement or every n measurements, n being a predetermined number, according to the ambient temperature measured at the time.

BRIEF DESCRIPTION OF THE DRAWINGS

The following description is of a non-limitative embodiment of the invention and refers to the attached figures, wherein.

DESCRIPTION OF THE PREFERRED EMBODIMENTS

Figure 1:
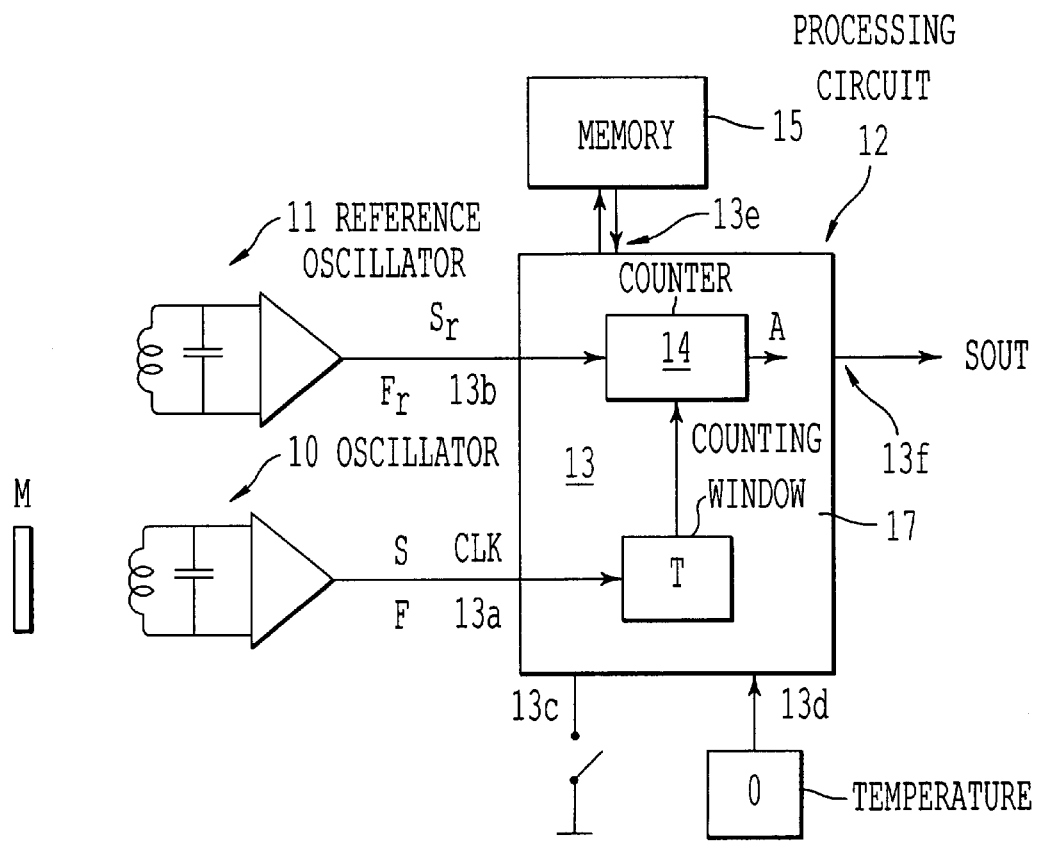
FIG. 1 is a diagram of the circuit of an inductive proximity detector of the present invention.

The inductive detector of FIG. 1 comprises a measurement oscillator 10 that transmits an oscillation to a shaping circuit such that it produces a pulsed measurement signal S the frequency F of which depends on the proximity of a ferrous or non-ferrous metal object M. The detector is either universal, i.e. capable of detecting objects irrespective of whether they are ferrous or non-ferrous at the same distance, or selective, i.e. only capable of detecting ferrous or non-ferrous objects.

A reference oscillator 11 is provided in the detector that, once it has been shaped, is capable of transmitting a pulsed reference signal $S_r$ the frequency $F_r$ of which is not dependent on the object. Oscillator 10 oscillates, for example, at a measurement frequency F of approximately 1 MHz that varies when it approaches a metal object and oscillator 11 oscillates, for example, at a fixed frequency F which may be several hundred kHz or several MHz according to the applications and which in the embodiment considered is 8 MHz. Frequencies F and $F_r$ can also be equal. The detector comprises a processing circuit 12 equipped with a programmed logic circuit, microcontroller or similar circuit 13 on one clock input 13a to which measurement signal S is applied and on one counter input 13b to which reference signal $S_r$ is applied. Counter input 13b is connected to a counter 14 of microcontroller 13. The microcontroller has a calibration input 13c and a temperature capture input 13d. A rewriteable memory 15, for example of the EEPROM type, is connected to an input/output 13e of the microcontroller and an output 13f of the microcontroller carries a control signal $S_{out}$ from the output of the detector.

Figure 3:
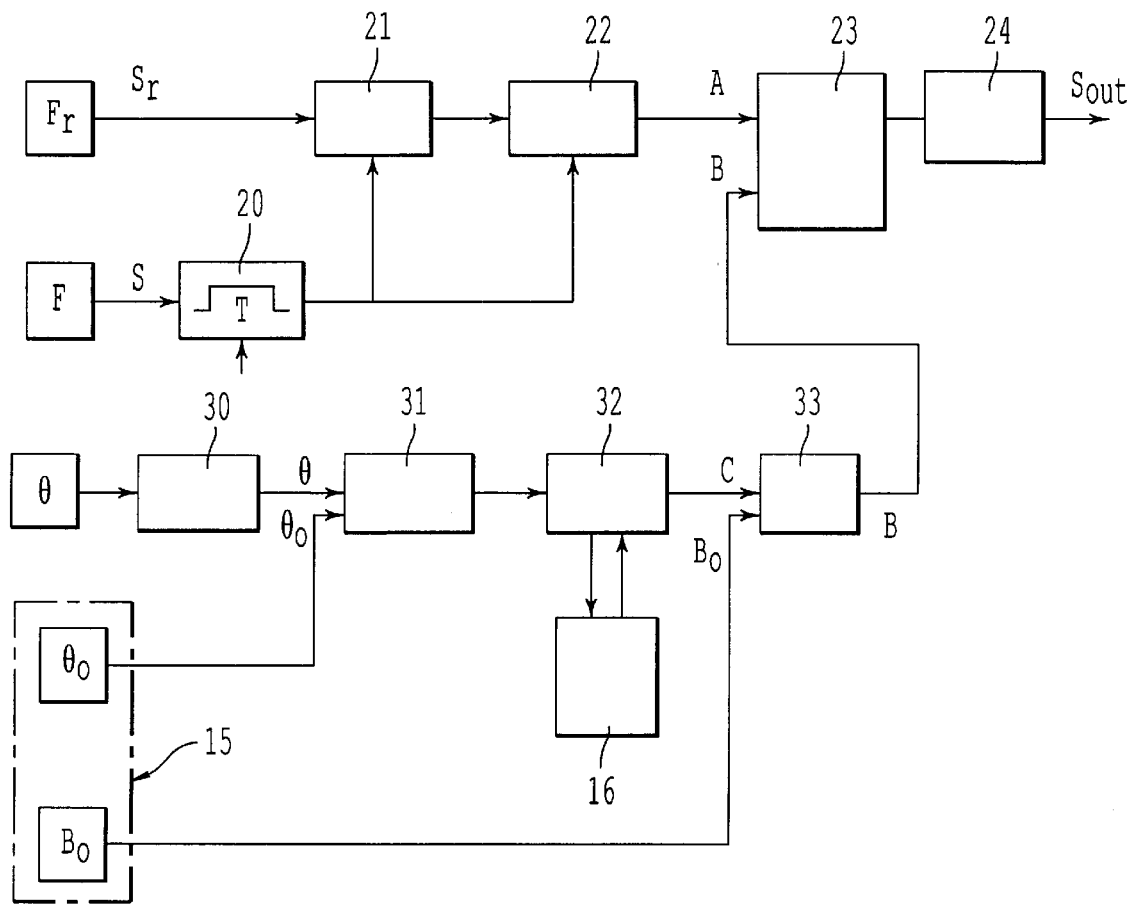
FIG. 3 is a synoptic diagram of the operating mode of the detector in FIG. 1.

FIG. 3 shows the main operating program of the detector. Measurement pulses S that match measurement frequency F are counted to create a counting window of width T defined in an operation 20; width T of this window is equal to a given constant number of clock periods of the microcontroller and is in inverse proportion to the frequency of S. Width T is equal to K/F, K being a constant. Counter 14 receives reference signal $S_r$ from input 13b and counts in stage 21, in window T which is controlled by measurement signal S, the number of pulses, for example several thousands, of reference signal $S_r$. This yields a counter value A that is read in a stage 22. In one version the pulses from measurement signal S are also counted in a window determined according to reference frequency $F_r$.

Counter value A is compared in a stage 23 with a correctable set point value B that is created as described below and that is updated cyclically, for example by being modified every measurement or, to save processing time, every n measurements, n possibly being equal to 3. An output control signal is emitted (operation 24) as a result of the comparison.

The temperature of the detector is captured in a stage 30 in which a numerical value θ is defined using an analog temperature detector device. This value is compared in a stage 31 with a value $θ_0$ that is defined in a calibration phase described below. The result is a calculated deviation E=θ−$θ_0$. The value $B_0$ is also established during the calibration phase. In a subsequent stage 32 in which a correction value C is established, the microcontroller searches in a correction table 16 for value C that is deviation E that was calculated. In a subsequent stage 33, the microcontroller calculates the sum B=$B_0$+C, and this value B is used in stage 23 as described above.

Figure 4:
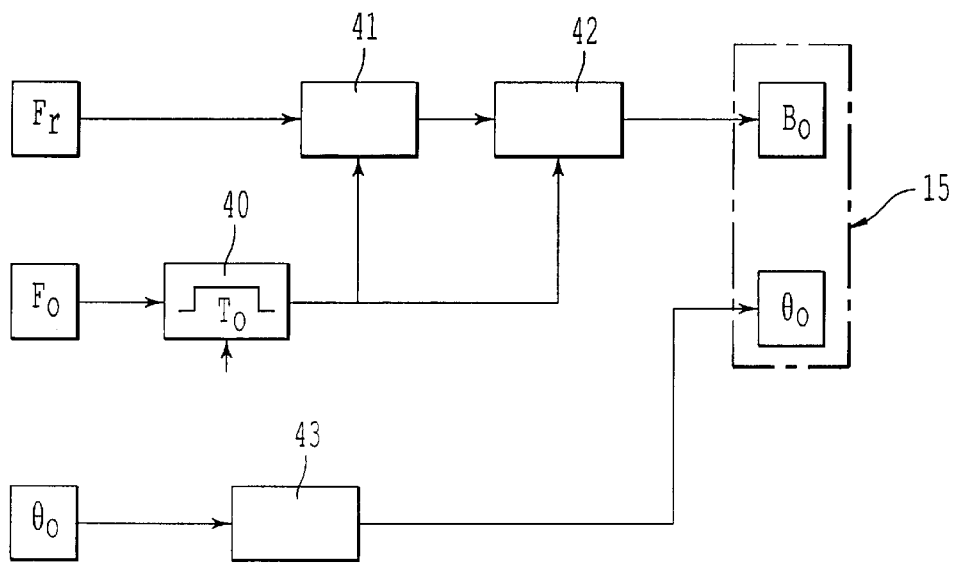
FIG. 4 is a synoptic diagram of the calibration of the detector.

The software that enables the two values $B_0$, $θ_0$ to be obtained in the calibration phase will now be described with reference to FIG. 4.

A target is positioned at the required detection distance (range) of the detector, then a calibration triggering order is formulated by the operator, preferably by earthing input 13c of the microcontroller.

The calibration triggering starts an operation 40 for defining the measurement window $T_0=K/F_0$, K being a constant and $F_0$ being the frequency of the oscillator that measures the range. The counter starts a counter operation 41 of the pulses of reference signal $S_r$ from the reference oscillator 11 after it has been shaped. The counter value $B_0$ obtained at the end of the measurement window $T_0$ is read in an operation 42 and stored in EEPROM 15.

The calibration is continued by an operation 43 in which the temperature is measured and the matching analogue value is converted into a digital value $\theta_0$ that is also stored in EEPROM 16. Both $B_0$ and $\theta_0$ are then taken into consideration in the current measurements, as seen above. The calibration described above overcomes the dispersions and variations that affect the components of the circuit. The switching hysteresis of the detector is included in the measurement software to correct the set point counter value B. Calibration is performed initially and whenever it may be required.

Figure 2:
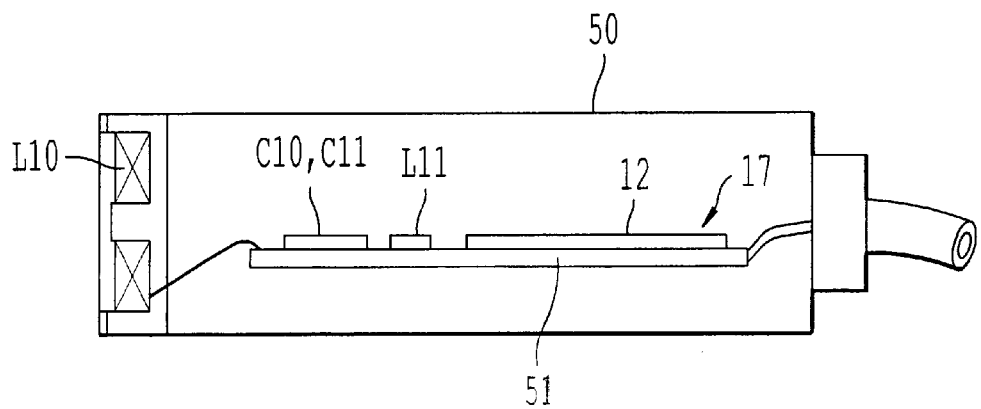
FIG. 2 is a schematic diagram of the casing of a detector of the present invention.

An example of a compact embodiment of the detector is shown schematically in FIG. 2. Casing 50 of the detector houses two oscillators 10, 11 that have LC oscillating currents. Inductor $L_{11}$ of oscillator 10 is an air inductor with or without a ferrite core. Inductor $L_{11}$ of oscillator 11 is located on printed circuit board 51 that includes processing circuit 12 and output circuit 17. Capacitors $C_{10}$, $C_{11}$ of both oscillators belong to the same capacitor network located on printed circuit board 51 in order to present drifts in temperature that are as close as possible to one another.

The detector described above is a universal type detector that detects from ferrous and non-ferrous objects alike at the same distance. It can also be a selective type detector, and frequency $F_r$ is then much lower, for example, approximately several tens of kHz. The invention also applies to capacitive detectors.

What is claimed is:

1. A proximity detector comprising:
   a measurement oscillator configured to transmit a pulsed signal having a frequency that is a function of a proximity of an object to be detected;
   a reference oscillator configured to transmit a pulsed signal having a frequency that does not depend on the object to be detected;
   a digital processing circuit that transmits an output signal that is a function of the signal transmitted by the measurement oscillator and a set point counter value, said digital processing circuit including a counter, wherein:
   the counter calculates a detection counter value that is a function of a number of pulses received from one of the measurement oscillator and the reference oscillator measured in a counting timing window, the counting timing window being dependent on the frequency of the other oscillator,
   the detection counter value is compared with the set point counter value by the digital processing circuit to create the output signal,
   the set point counter value is stored in a memory associated with the digital processing circuit, and is correctable depending on a temperature, and
   a calibration counter value is introduced into the memory when the detector is calibrated using an object located within a nominal range, the set point counter value being obtained by correcting the calibration counter value as a function of the temperature.

2. The proximity detector of claim 1, wherein the digital processing circuit is further configured to modify the set point counter value cyclically at an end of a number of predetermined measurements.

3. The proximity detector of claim 1, wherein the counting timing window is a function of the frequency of the measurement oscillator, and the digital processing circuit has a counting input connected to the reference oscillator.

4. The proximity detector of claim 1, wherein the digital processing circuit is further configured to:
   store the calibration counter value and a reference temperature value when the detector is calibrated;
   measure the current temperature value when an object is detected, a correction quantity being determined from a correction table as a function of a deviation calculated by the processing circuit between the current temperature value and the reference temperature value; and
   add the calibration counter value to the correction quantity to create a corrected set point counter value.

5. The proximity detector of claim 1, wherein the digital processing circuit is further configured to calibrate the detector by means of a learning operation.

6. The proximity detector of claim 1, wherein the digital processing circuit is further configured to create, at the beginning of the operation in which the detector is calibrated, a pulse counting window having a width that is in inverse proportion to the frequency of the measurement oscillator.

7. The proximity detector of claim 1, wherein the detector is an inductive type detector and the measurement oscillator and the reference oscillator are LC oscillating currents having capacitors that belong to a same capacitor network.

8. The proximity detector of claim 1, wherein the digital processing circuit and an output circuit are arranged on a printed circuit board and an inductor of the reference oscillator is provided on the printed circuit board, and an inductor of the measurement oscillator is one of an air and a ferrite inductor.

* * * * *